United States Patent
Chen et al.

(10) Patent No.: US 11,036,581 B2
(45) Date of Patent: Jun. 15, 2021

(54) NON-VOLATILE MEMORY CONTROL CIRCUIT WITH PARALLEL ERROR DETECTION AND CORRECTION

(71) Applicant: Apple Inc., Cupertino, CA (US)

(72) Inventors: Wei Chen, San Diego, CA (US); Sanjay Pant, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 21 days.

(21) Appl. No.: 16/535,643

(22) Filed: Aug. 8, 2019

(65) Prior Publication Data

US 2021/0042188 A1 Feb. 11, 2021

(51) Int. Cl.
*G06F 11/10* (2006.01)
*G11C 29/52* (2006.01)

(52) U.S. Cl.
CPC .......... *G06F 11/1068* (2013.01); *G11C 29/52* (2013.01)

(58) Field of Classification Search
CPC ............................ G11C 29/52; G06F 11/1068
See application file for complete search history.

(56) References Cited

U.S. PATENT DOCUMENTS

| | | | | |
|---|---|---|---|---|
| 4,354,217 A * | 10/1982 | Mahon | ............... | G06F 11/2015 257/E23.149 |
| 4,581,741 A | 4/1986 | Huffman et al. | | |
| 4,750,177 A | 6/1988 | Hendrie et al. | | |
| 6,101,614 A * | 8/2000 | Gonzales | ............. | G06F 11/106 714/6.1 |
| 6,549,460 B2 * | 4/2003 | Nozoe | ................ | G06F 11/1068 365/185.09 |
| 6,690,595 B1 * | 2/2004 | Srinivasan | ............. | G11C 15/00 365/189.07 |
| 7,184,356 B2 | 2/2007 | Noguchi et al. | | |
| 7,634,707 B2 | 12/2009 | Leung et al. | | |
| 2008/0163031 A1 * | 7/2008 | Hsieh | ................. | G06F 11/1068 714/773 |
| 2008/0285317 A1 * | 11/2008 | Rotzoll | ................ | H02M 7/493 363/80 |
| 2010/0293439 A1 * | 11/2010 | Flynn | .................... | G06F 11/108 714/763 |
| 2012/0071313 A1 | 6/2012 | Takano et al. | | |
| 2013/0219216 A1 * | 8/2013 | Huang | ............. | G11C 29/56008 714/26 |
| 2014/0226409 A1 * | 8/2014 | Tran | ....................... | G11C 5/147 365/185.18 |
| 2018/0090214 A1 * | 3/2018 | Yamaguchi | ........ | G11C 16/3454 |

* cited by examiner

*Primary Examiner* — Guy J Lamarre
(74) *Attorney, Agent, or Firm* — Kowert, Hood, Munyon, Rankin & Goetzel, P.C.

(57) ABSTRACT

An apparatus includes a non-volatile storage circuit that includes a primary copy of a data value in a first storage location and a redundant copy of the data value in a second, different storage location. The data value includes one or more bits. The apparatus further includes an error detection circuit configured to retrieve contents of the first and second storage locations in response to a request for the data value. The error detection circuit is further configured to perform an error correction operation on the retrieved contents of the first and second storage locations to generate a data output responsive to the request, and to perform an error detection operation to generate an error signal that indicates whether the retrieved contents of the first and second storage locations are different.

20 Claims, 11 Drawing Sheets

NON-VOLATILE MEMORY CONTROL CIRCUIT WITH PARALLEL ERROR DETECTION AND CORRECTION

BACKGROUND

Technical Field

Embodiments described herein are related to the field of integrated circuits, and more particularly to error detection and correction of data from a non-volatile memory.

Description of the Related Art

Computer systems, including integrated circuits (IC), such as a systems-on-chip (SoC), commonly include one or more types of non-volatile memory (NVM) used to store information while a system is powered-off. Flash, electrically-erasable programmable read-only memory (EEPROM), ferroelectric random-access memory (FeRAM), and one-time programmable (OTP) fuses are a few examples of NVM that may be utilized in a computer system. Some types of information stored in these NVMs may need to be accessed quickly in response to particular events, such as a power-on or a reset of the system. For example, configuration data for an IC may be stored in an NVM and then retrieved in response to a power-on or reset event. Configuration data allows one or more characteristics of an IC to be adjusted after the IC has been manufactured. Configuration data may allow a frequency of a clock source or a voltage level of a reference signal to be adjusted to a target value. Various features of the IC may be enabled or disabled based on particular bit values in a configuration register, allowing the IC to be configured for a particular application. In response to a power-on or reset of the IC, the configuration data may be read from the NVM and then used to initialize the IC before it returns to a standard operational mode.

SUMMARY OF THE EMBODIMENTS

Broadly speaking, a system, an apparatus, and a method are contemplated in which the apparatus may include a non-volatile storage circuit that includes a primary copy of a data value in a first storage location and a redundant copy of the data value in a second, different storage location. The data value includes one or more bits. The apparatus may further include an error detection circuit configured to retrieve contents of the first and second storage locations in response to a request for the data value. The error detection circuit may be further configured to perform an error correction operation on the retrieved contents of the first and second storage locations to generate a data output responsive to the request, and to perform an error detection operation to generate an error signal that indicates whether the retrieved contents of the first and second storage locations are different.

In a further example, the error detection circuit may be further configured to perform the error correction operation and the error detection operation in parallel. In one example, the non-volatile storage circuit may include a plurality of fuse circuits that are configured to have a logic low value in an unprogrammed state and a logic high value in a programmed state.

In another example, the data value may include settings for initializing an integrated circuit. The request for the data value may correspond to an indication that the integrated circuit is beginning to power on. In an embodiment, the redundant copy of the data value is different from the primary copy of the data value.

In one example, the non-volatile storage circuit may include one or more rows and one or more columns of memory cells. Memory cells for corresponding data bits in the first and second storage locations may not be located in a same row or a same column of memory cells.

In a further example, to perform the error correction operation, the error detection circuit may be configured to perform a bitwise logical-OR function between the retrieved contents of the first storage location and the second storage location. To perform the error detection operation, the error detection circuit may be configured to perform a bitwise logical-XOR function between the retrieved contents of the first storage location and the second storage location.

BRIEF DESCRIPTION OF THE DRAWINGS

The following detailed description makes reference to the accompanying drawings, which are now briefly described.

Figure 1:
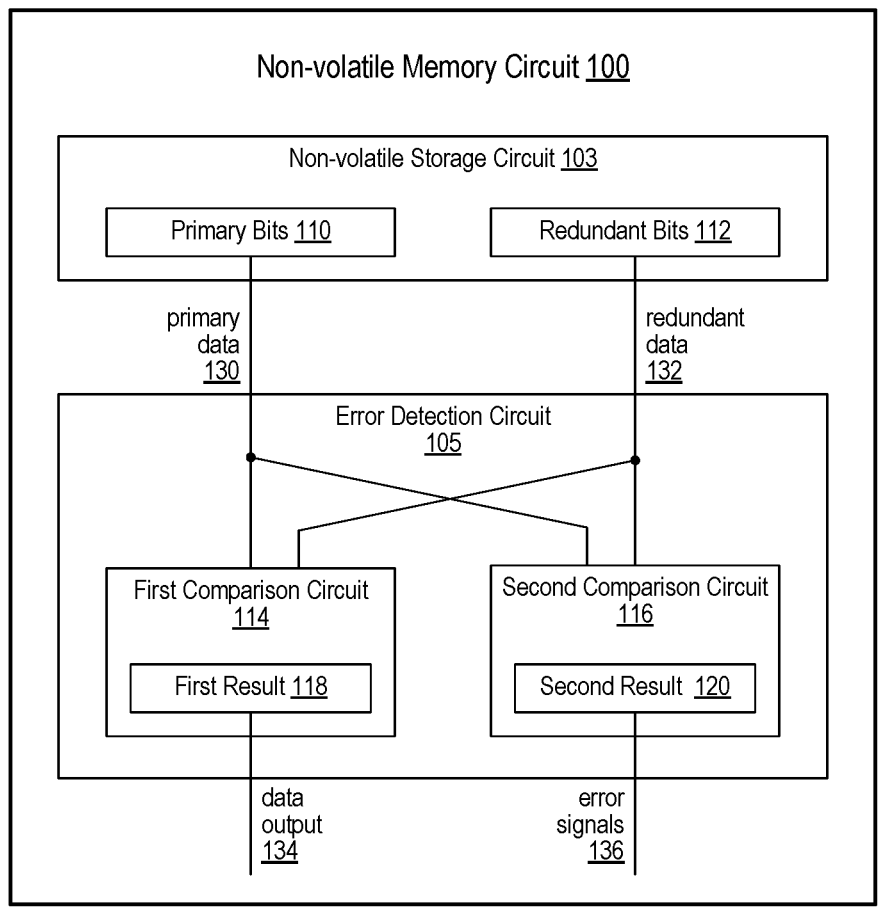
FIG. 1 illustrates a block diagram of an embodiment of a non-volatile memory circuit.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. The phrase "based on" is thus synonymous with the phrase "based at least in part on."

DETAILED DESCRIPTION OF EMBODIMENTS

Various types of non-volatile memory may be selected for use in a computer system depending on particular desired characteristics that are for the computer system. As is understood in the art, non-volatile memory is memory that is configured to store information even while the memory is not being powered—non-volatile memory thus stands in contrast to volatile memory. For example, to store configuration data that is read upon a power-on event, an NVM that can be read quickly and reliably as a voltage level of a power supply signal ramps up may be desired—such an NVM may take the form of fuses or FeRAM, for example. As used herein, "configuration data" refers to one or more bit values that are used to initialize a computer system by storing the bit values into one or more registers in one or more integrated circuits (ICs) in the computer system. Since configuration data may be used to set operating characteristics of the one or more ICs, the speed with which the NVM is read may have an impact on how quickly the ICs can be readied for operation. Accuracy is also important, as incorrect configuration data may result in undesired operating characteristics being utilized.

In some embodiments, fuses may be utilized as NVM since they are typically reliable after being programmed and are relatively inexpensive as compared to other NVM options. Fuses are commonly found in home electronics and automobiles, and are usually used to protect devices from sudden increases in current. Fuses may be scaled in size for use in an IC where they may function as NVM: an intact fuse may correspond to a first logic value (e.g., logic low), while a blown fuse may correspond to a second logic value (e.g., logic high). Fuses integrated on an IC typically include a wire trace, which may be formed of metal or polysilicon, coupled to a sensing circuit. This sensing circuit may determine if the fuse wire is intact or not based on conduction of current through the fuse wire. An intact fuse should have a low impedance (typically much less than one kilo-ohm) relative to a blown fuse (which will typically have an impedance greater than one megaohm). In some embodiments, the fuse wire is coupled to programming logic that can program, or "blow," a fuse by applying a sufficient amount of current to cause the wire to melt and separate, thereby creating a high-impedance state between a power signal and the sensing circuit. After such programming, the sensing circuit will detect high impedance in the path to the power signal, meaning that the fuse will be interpreted as having a logic value corresponding to a blown state.

After fuses have been programmed, they may be tested to verify the data integrity of the programmed value, for example, that the blown fuse wires have sufficiently high impedance such that current through the fuse wire is below a threshold amount. Such testing may be needed because the fuse wire may, over the lifetime of the computer system, experience conditions that allow a blown wire to partially reform to a point at which the blown wire may conduct sufficient current that causes the sensing circuit to read the blown wire as unprogrammed. For example, electromigration may cause formerly separated pieces of the blown wire to come into contact and become conductive. Electromigration may occur when blown fuses are under a constant or frequent voltage bias while powered from the power signal. This voltage bias may cause conductive ions from the blown fuse wire to move over the lifetime of the computer system, thereby gradually reforming a conductive path between two ends of the blown fuse wire. In addition, the IC may reach operating temperatures that aid the electromigration effects. In sum, if the impedance of the blown fuse wire drops to a sufficiently low enough value, then the sensing circuit may misread the blown fuse as unblown.

Circuits described above and herein may, in various embodiments, be implemented using devices corresponding to metal-oxide semiconductor field-effect transistors (MOSFETs), such as fin field-effect transistors (FinFETs), or to any other suitable type of transconductance device. As used and described herein, a "logic low level," or a "logic low," corresponds to a voltage level sufficiently low to enable a p-channel MOSFET, and a "logic high level," or a "logic high," corresponds to a voltage level sufficiently high to enable an n-channel MOSFET. In various other embodiments, different technology, including technologies other than complementary metal-oxide semiconductor (CMOS), may result in different voltage levels for "logic low" and "logic high." A "logic signal," as used herein, may correspond to a signal generated in a CMOS, or other technology, circuit in which the signal transitions between low and high logic levels.

The present disclosure describes embodiments for detecting and correcting errors in data that is read from a non-volatile memory. One such embodiment includes non-volatile memory that includes a primary copy of a data value and a redundant copy of the data value. An error detection circuit is included that reads the primary and redundant copies of the data value. To generate a data output that is returned as a result of the read, the error detection circuit further performs an error correction operation on the two copies. The error detection circuit also performs an error detection operation to generate an error signal that indicates whether the primary and redundant copies of the data value are different. Use of these techniques may improve speed and accuracy of data retrieved from the NVM, thereby allowing the retrieved data to be utilized more quickly than with traditional methods. Manufacturing yield and reliability may also be increased on devices that utilize these techniques.

A block diagram for an embodiment of a non-volatile memory circuit is illustrated in FIG. 1. Non-volatile memory circuit 100 may be included in an integrated circuit (IC), such as a system-on-chip (SoC) or a power management unit. As illustrated, non-volatile memory circuit 100 includes non-volatile storage circuit 103 and error detection circuit 105. Non-volatile storage circuit 103 stores information that includes primary bits 110 and redundant bits 112. Error detection circuit 105 includes first comparison circuit 114 that generates first result 118, and second comparison circuit 116 that generates second result 120. Non-volatile memory circuit 100 generates two sets of output signals, data output 134 and error signals 136.

As illustrated, non-volatile memory circuit 100 includes non-volatile storage circuit 103 that includes a primary copy of a data value in a first storage location (primary bits 110) and a redundant copy of the data value in a second, different storage location (redundant bits 112). As used herein a "redundant copy" of the data value is an additional, identical copy of the primary copy of the data value. Thus, if the data value is 00010110 in binary, both copies will be identical; accordingly, the "redundant copy" is not used in this disclosure to refer to error correcting codes, for example. Accordingly, when information is written to non-volatile storage circuit 103, two copies of the information are stored. A first copied is stored into primary bits 110, and a second copy is stored into redundant bits 112. Each of primary bits 110 and redundant bits 112 correspond to one or more memory cells (bit cells) included in non-volatile storage circuit 103. In various embodiments, bit cells included in non-volatile storage circuit 103 may be arranged into one or more arrays. If more than one array is included, then, in some embodiments, primary bits 110 may be in one array while redundant bits 112 are in a different array, thus providing protection against a failure of an entire array. In other embodiments, both of primary bits 110 and redundant bits 112 may be dispersed across two or more arrays to mitigate against a failure of individual rows and/or columns within an array.

Non-volatile storage circuit 103, as shown, includes bit cells capable of storing one of two logic states, either logic high or logic low. In some non-volatile memory designs, a failing bit cell may correspond to either a bit cell set for a logic high state being misread as a logic low or vice versa. In the illustrated embodiment, the bit cells of non-volatile storage circuit 103 have a predominant failure mode: a bit cell set for a logic high state is instead misread as a logic low. Stated another way, in the disclosed embodiment, misreading a blown fuse bit cell as an unblown fuse cell is more likely than misreading an unblown fuse bit cell as blown. It is noted that in the illustrated embodiment, a blown fuse has a logic high value. In other embodiments, however, a blown fuse may correspond to a logic low value.

Error detection circuit 105, as shown, is configured to retrieve contents of the first and second storage locations in response to a request for the data value. In various embodiments, this request may be issued by a processor coupled to non-volatile memory circuit 100, or may be initiated in response to a particular event such as a power-on or reset. Primary bits 110 are read to generate primary data 130, while redundant bits 112 are read to generate redundant data 132.

Error detection circuit 105 is configured to perform an error correction operation on the retrieved contents of the first and second storage locations to generate a data output in response to the request. First comparison circuit 114 compares primary data 130 to redundant data 132, and based on the respective values, determines a value for data output 134 that may be stored in first result 118. First comparison circuit 114 generates a particular value for data output 134 when no errors are present in primary data 130 and redundant data 132. First comparison circuit 114 generates the same particular value data output 134 when no errors are present in primary data 130 and one or more errors are present in redundant data 132, and vice versa. Data output 134 may be sent to a processor or other device coupled to non-volatile memory circuit 100.

Error detection circuit 105 is further configured to perform an error detection operation to generate an error signal that indicates whether the retrieved contents of the first and second storage locations are different. In parallel (e.g., in an overlapping manner) with first comparison circuit 114, second comparison circuit 116 compares primary data 130 to redundant data 132 using a different comparison method than first comparison circuit 114. This different comparison produces error signals 136 that may be stored in second result 120. In some embodiments, error signals 136 may include an individual signal for each bit in data output 134, with each individual signal indicating whether a respective set of bits in primary data 130 and redundant data 132 match. In other embodiments, error signals 136 may be a single signal that indicates, in binary fashion, whether any differences exist between primary data 130 and redundant data 132. Error signals 136 may be sent to a processor or other device coupled to non-volatile memory circuit 100.

As noted above, performing operations in "parallel" refers to two or more operations being performed during a same time period, but is not intended to imply that the operations must start and/or stop at exactly the same time. For example, first comparison circuit 114 and second comparison circuit 116 may be configured to begin their respective comparisons in response to an assertion of a same control or clock signal, but due to respective circuit designs and variations in a fabrication process, the two comparison circuits may begin and/or end their respective comparisons at different points in time. Performing operations in parallel includes, for example, a first operation that overlaps a second operation. Performing operations in parallel does not include, for example, performing and completing a first operation, and then performing and completing a second operation.

It is noted that non-volatile memory circuit 100 as illustrated in FIG. 1 is merely an example. The illustration of FIG. 1 has been simplified to highlight features relevant to this disclosure. Various embodiments may include different configurations of the circuit blocks, including additional circuit blocks such as a memory controller circuit including read and write circuitry.

The non-volatile memory circuit illustrated in FIG. 1 includes a non-volatile storage circuit as well as an error detection circuit. Such circuits may be implemented using a variety of design techniques. Particular examples of a non-volatile storage circuit and an error detection circuit are shown in FIG. 2.

Figure 2:
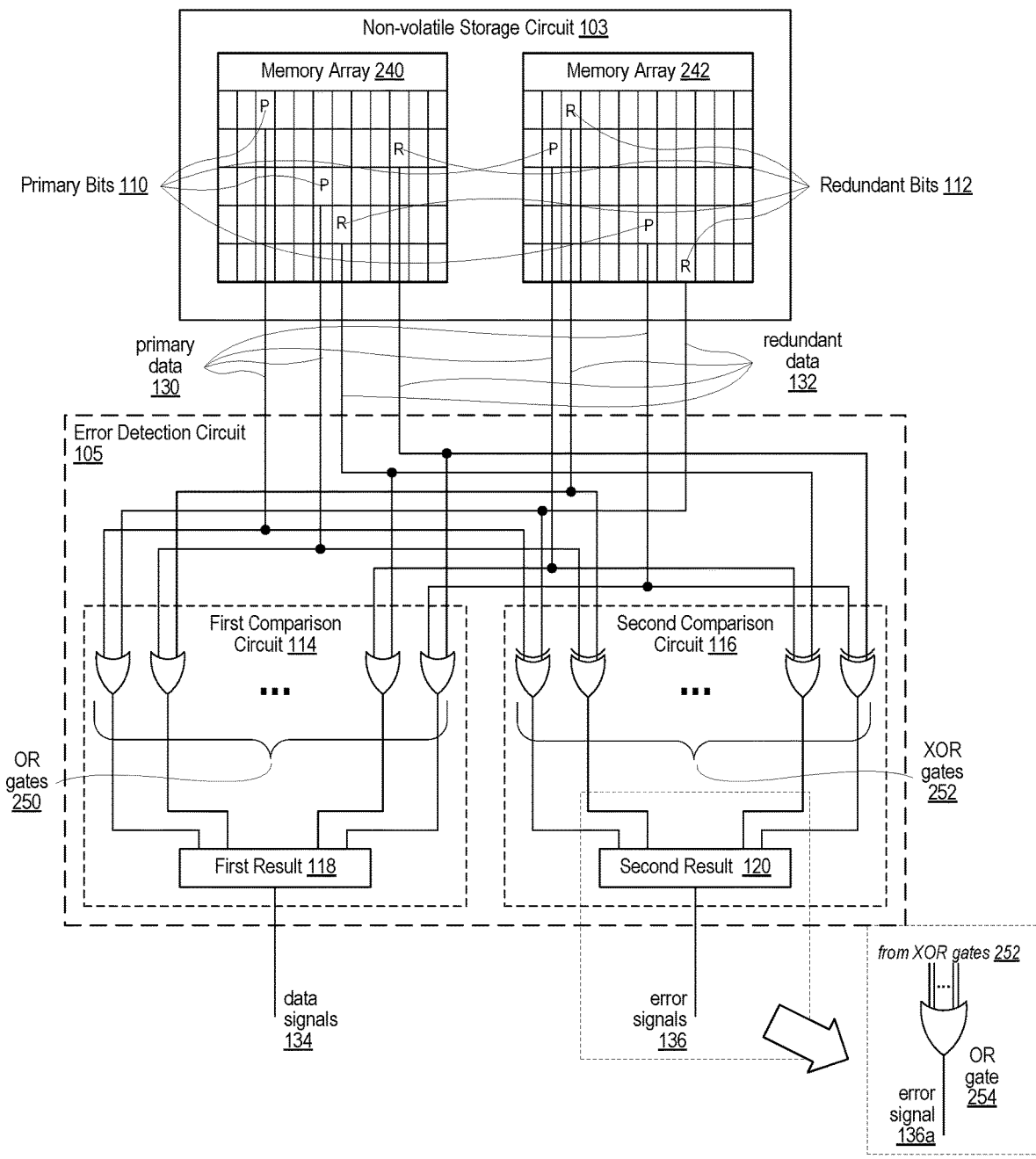
FIG. 2 shows a block diagram of an embodiment of an error detection circuit included in a non-volatile memory circuit.

Moving to FIG. 2, a block diagram of another embodiment of non-volatile memory circuit 100 is shown. As illustrated, non-volatile memory circuit 100 includes non-volatile storage circuit 103 and error detection circuit 105. Non-volatile storage circuit 103 includes memory arrays 240 and 242, and is coupled to error detection circuit 105 to provide primary data 130 and redundant data 132. Error detection circuit 105 includes first comparison circuit 114 and second comparison circuit 116. A plurality of OR gates 250 are included in first comparison circuit 114 and a plurality of XOR gates 252 are included in second comparison circuit 116. An output of OR gates 250 is captured as first result 118 and, in a similar manner, an output of XOR gates 252 is captured as second result 120.

As illustrated, each of memory arrays 240 and 242 include a plurality of bit cells that are arranged into a plurality of rows and columns. As disclosed above, primary bits 110 and redundant bits 112 each correspond to a same data value that is stored in non-volatile storage circuit 103. Primary bits 110 and redundant bits 112 are distributed across these rows and columns such that bit cells for corresponding data bits in primary bits 110 and redundant bits 112 are not located in a same row or a same column of bit cells within a same one of memory arrays 240 and 242. Such a distribution of a data value across bit cells of a memory array may provide mitigation against a failure of a row or a column of bit cells in either of memory arrays 240 and 242. As shown in FIG. 2, within memory array 240, bit cells that are included in primary bits 110 and redundant bits 112 do not share a common row or a common column. The same is true for memory array 242. In some embodiments, memory array 240 may be susceptible to a failure mode in which data stored in bit cells arranged in a common row or column cannot be read accurately. For example, a particular bit cell may be damaged (e.g., during a programming step), resulting in a short or open circuit being created on a word line (row) or bit line (column) coupled to the damaged bit cell. As a result, all bit cells coupled to that word line or bit line may become inaccessible and the stored data, therefore, unreadable. By distributing individual bits for a given data value across rows and columns, such a row or column failure may impact only a single bit of either primary bits 110 or redundant bits 112, allowing error detection circuit 105 to potentially correct and detect the one bad bit value.

To perform an error correction operation, first comparison circuit 114 receives primary data 130 and redundant data 132, each representing the stored data value. In the illustrated embodiment, as described above, a predominant failure mode for the bit cells of non-volatile storage circuit 103 is a bit cell that is set for a logic high state is instead misread as a logic low. Based on this risk of a logic high being misread as a logic low, each bit of primary data 130 is paired with a corresponding bit from redundant data 132 and used as the inputs to one of OR gates 250. For example, the most significant bit (MSB) of primary data 130 is paired with the MSB of redundant data 132, the next MSB of primary data 130 is paired with the next MSB of redundant data 132, and so forth down to the least significant bit (LSB) of primary data 130 being paired with the LSB of redundant data 132.

OR gates 250 are a group logical OR gates that each receive two input signals and generate an output signal based on the logic values of the two input signals. If either input signal has a logic high state, then the output signal is a logic high. Otherwise, if both input signals have logic low states, then the output signal is a logic low. First comparison circuit 114, therefore, performs a bitwise logical-OR function between primary data 130 and redundant data 132. If any one bit of each pair of primary and redundant bits is misread as a logic low rather that a logic high, the output of the corresponding OR gate 250 will be a logic high. The combined outputs of OR gates 250 are concatenated into a single error-corrected value captured as first result 118. This error-corrected copy of the data value is, therefore, generated with identical value both with and without errors present in the primary or redundant copies of the data value.

In some embodiments, first result 118 is latched and stored until a next data value is retrieved from non-volatile storage circuit 103 or a power-down or reset of non-volatile memory circuit 100 occurs. First result 118 may be sent to other circuits (e.g., a processor circuit and/or a configuration circuit) as data output 134. Additional details of how error detection circuit 105 generates first result 118 are disclosed below in regards to FIGS. 3 and 4.

To perform an error detection operation, second comparison circuit 116 receives primary data 130 and redundant data 132. Whereas first comparison circuit 114 performs a bitwise logical-OR function as part of the error correction operation, second comparison circuit 116 executes an error detection operation that includes performing a bitwise logical-XOR function between primary data 130 and redundant data 132. XOR gates 252 are included in second comparison circuit 116 to perform the bitwise logical-XOR function. As described above for first comparison circuit 114, each bit of primary data 130 is paired with a corresponding bit from redundant data 132 and used as the inputs to one of XOR gates 252.

Similar to OR gates 250, XOR gates 252 are a group logical XOR gates that each receive two input signals and generate an output signal based on the logic values of the two input signals. If the two input signals have a same logic state (high or low), then the output signal is a logic low. Otherwise, if the two input signals have different logic states, then the output signal is a logic high. Second comparison circuit 116, therefore, produces a logic high signal for each pair of primary and redundant bits that do not have matching logic values. In some embodiments, the combined outputs of XOR gates 252 are concatenated into a single error-detection value captured as second result 120, which may be latched. Second result 120 may then be sent to one or more other circuits as error signals 136.

In other embodiments, the combined outputs of XOR gates 252 are received as inputs to OR gate 254. If an output of any one or more of XOR gates 252 is a logic high, then the output signal from OR gate 254 is high, indicate that at least one error has occurred. Otherwise, if all output signals of XOR gates 252 are low (indicating no mismatched bit pairs), then the output signal of OR gate 254 is low. The output signal of OR gate 254 is error signal 136a and may be latched.

Error signals 136 (or error signal 136a) may used as an interrupt or exception signal to indicate if any pair of corresponding primary and redundant bits have mismatched values. An interrupt or exception may be used to initiate a repair operation to correct or replace any failing bit cells in non-volatile storage circuit 103. For example, in response to a determination that error signals 136 (or error signal 136a) indicates a difference between primary data 130 and redundant data 132, non-volatile memory circuit 100 may identify one or more bits of the data value that differ. For example, non-volatile memory circuit 100 may read primary and redundant copies of all stored data values in the non-volatile storage circuit 103 and compare each pair of primary and redundant copies to identify all instances in which a primary data bit and corresponding redundant data bit do not have the same logic value. For each instance, non-volatile memory circuit 100 may store data for the one or more identified failing bits in a new location in non-volatile storage circuit 103. In some embodiments, an unused location in non-volatile storage circuit 103 may be identified and used. In other embodiments, a particular row and/or column of memory array 240 or 242 may be reserved for use as back-up bit cells to replace an identified failing bit cell.

It is noted that the embodiment of FIG. 2 is merely an example to demonstrate the disclosed concepts. In other embodiments, a different combination of circuits may be included. For example, in the illustrated embodiment, two memory arrays are shown in non-volatile storage circuit 103. In other embodiments, a single memory array may be utilized, or more than two memory arrays may be included. Although four OR gates and four XOR gates are illustrated in the first and second comparison circuits, respectively, an actual number of gates may correspond to a number of bits included in the primary and redundant copies of the data value.

In the descriptions of non-volatile memory circuit 100 in FIGS. 1 and 2, an error detection circuit is disclosed as generating error-corrected values and error signals. As stated above, FIGS. 3 and 4 provide additional details regarding how an embodiment of an error detection circuit may generate these error-corrected values and error signals.

Figure 3:
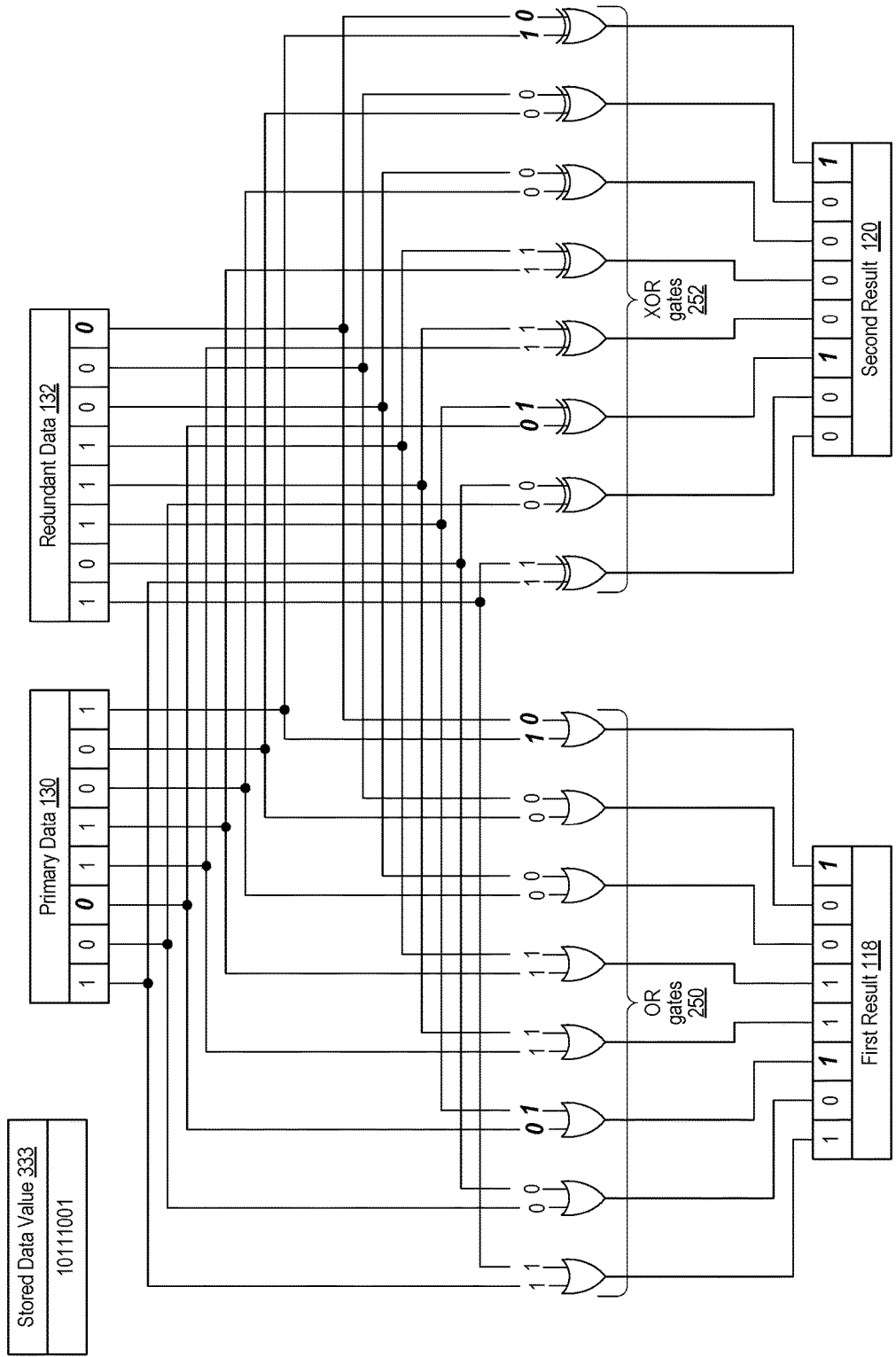
FIG. 3 depicts a block diagram of a particular embodiment of an error detection circuit.
Figure 4:
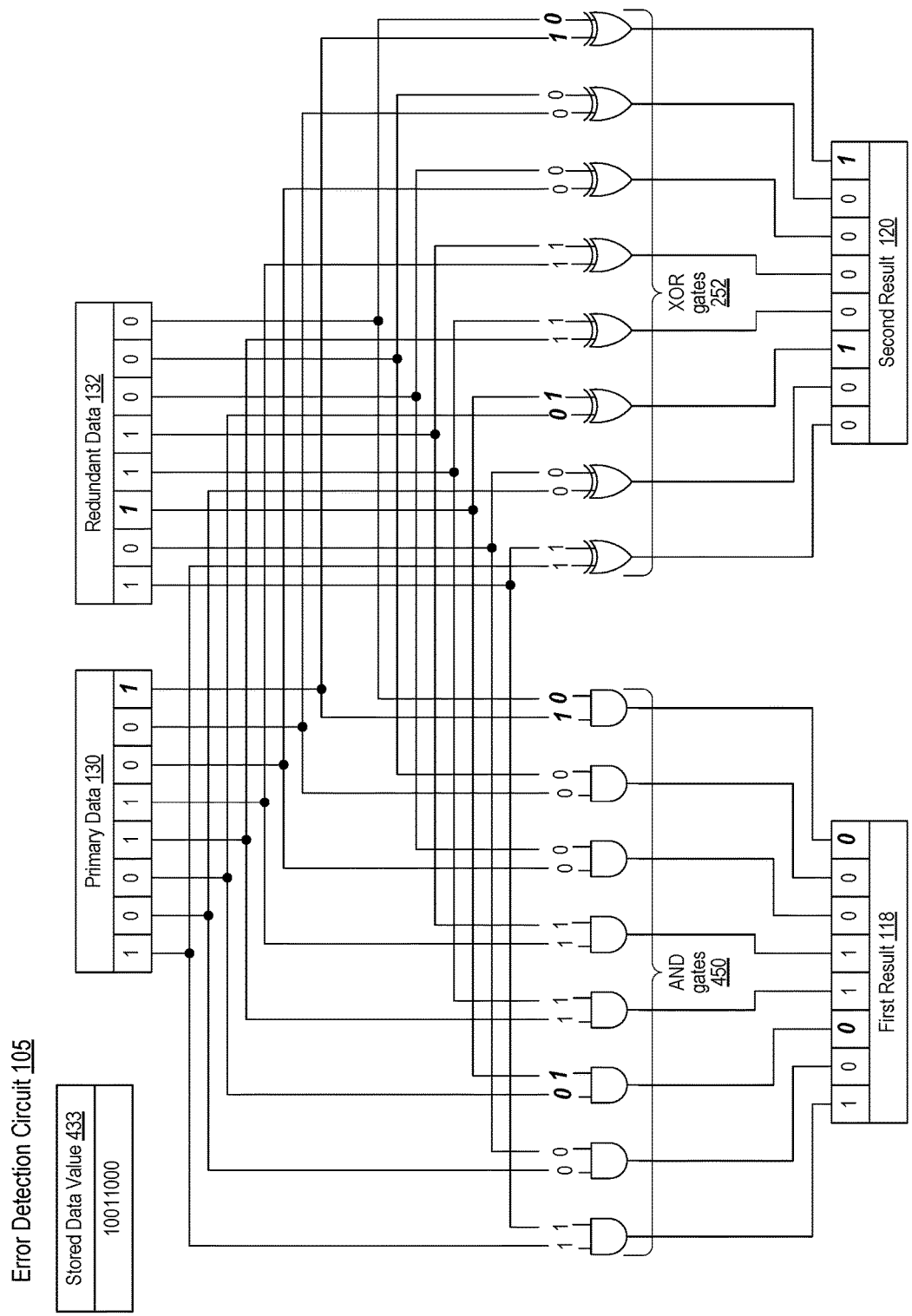
FIG. 4 illustrates a block diagram of a different embodiment of an error detection circuit.

Turning to FIG. 3, an embodiment of error detection circuit 105 is illustrated. As illustrated, primary data 130 and redundant data 132 each include eight bits of data, representing respective values of bit cells in non-volatile storage circuit 103 in FIGS. 1 and 2. For this example, stored data value 333 is the data value that was stored in non-volatile storage circuit 103 with a binary value of 0b10111001. Primary data 130 has a binary value of 0b10011001 while redundant data 132 has a binary value of 0b10111000. Accordingly, each of primary data 130 and redundant data 132 has a single bit error as compared to stored data value 333. For the illustrated example, a predominant failure mode for non-volatile storage circuit 103 is a bit cell with a logic high value being misread as a logic low value. The failed bits in primary data 130 and redundant data 132 are indicated in bold and italic font.

As described above, an MSB of primary data 130 and an MSB of redundant data 132 are paired as inputs to a first one of OR gates 250 and a first one of XOR gates 252. Pairs of subsequently significant bits of primary data 130 and redundant data 132 are paired into the remaining ones of OR gates 250 and XOR gates 252, down to the respective LSBs of primary data 130 and redundant data 132. For each of OR gates 250, an output signal is coupled to a respective bit of first result 118. In a similar manner, an output signal of each of XOR gates 252 is coupled to a respective bit of second result 120.

First result 118 is the error-corrected value that corresponds to stored data value 333. For each pair of input signals, each of OR gates 250 generates an output signal with a logic high if either input signal is a logic high. Referring to the two mismatched pairs of inputs (indicated by bold italic font), the respective OR gates generate logic high outputs into first result 118. Since the predominant failure mode is a logic high value being misread as a logic low value, when a mismatched pair is encountered, the logic high value is taken as the correct bit value and is used to generate first result 118. As shown, the value of first result 118 is 0b10111001, accurately corresponding to stored data value 333.

Second result 120 is the error signal value that indicates if any bits differ between primary data 130 and redundant data 132. Each of XOR gates 252 generates a logic low output signal if both input signals are the same and a logic high output signal if the two input signals have different logic values. Accordingly, any bit in second result 120 with a logic high value indicates a bit pair mismatch between primary data 130 and redundant data 132. As shown, the two mismatched bit pairs (again, indicated by bold, italic font) result in the two corresponding bits of second result 120 being set to logic high values. This non-zero value of second result 120 may be used to initiate a repair operation as described above.

It is noted that the error correction and error detection operations are performed in parallel. Depending on respective propagation delays through OR gates 250 and XOR gates 252, the respective values for first result 118 and second result 120 may be valid at or nearly at a same point in time. In some embodiments, the values of first result 118 and second result 120 may be latched into respective latch circuits (e.g., flip-flop circuits) using a same clock signal to enable the latching. Furthermore, first result 118 is not based on second result 120, and vice versa. That is to say, a value of second result 120 is not determined first and then used to generate the value of first result 118, nor is a value of first result 118 used to generate a value of second result 120.

The example shown in FIG. 3 assumes that the predominant failure mode of bit cells in non-volatile storage circuit 103 is a logic high value being misread as a logic low value. FIG. 4 provides an example of how error detection circuit 105 may be implemented in an embodiment in which the predominant failure mode is a logic low value being misread as a logic high.

Proceeding to FIG. 4, another embodiment of error detection circuit 105 is illustrated. Primary data 130 and redundant data 132 again include eight bits of data each, representing respective copies of stored data value 433 as stored in non-volatile storage circuit 103. Stored data value 433 has a binary value of 0b10011000. Primary data 130 has a binary value of 0b10011001 while redundant data 132 has a binary value of 0b10111000. Similar to the example of FIG. 3, each of primary data 130 and redundant data 132 has a single bit error as compared to stored data value 433. In this example, the predominant failure mode for non-volatile storage circuit 103 is a bit cell with a logic low value being misread as a logic high value. The failed bits in primary data 130 and redundant data 132 are indicated in bold and italic font.

As described in regards to FIG. 3 above, determining error signals corresponds to identifying bits of primary data 130 that do not match corresponding bits of redundant data 132. Determining mismatched bits can be performed using the same style of circuit used in FIG. 3. XOR gates 252, therefore, are used in a same manner as described above to generate second result 120.

The error correction operation, however, differs from the example of FIG. 3 due to the change of the failure mode. OR gates 250 have been replaced with AND gates 450. Each of AND gates 450 generate an output signal with a logic high value when both input signals have logic high values and otherwise generates an output signal with a logic low signal when both input signals are low or mismatched. Since the predominant failure mode in this example is a logic low value being misread as a logic high value, when a mismatched pair is encountered, the logic low value is taken as the correct bit value and is used to generate first result 118. As shown, first result 118 has a binary value of 0b10011000, accurately matching stored data value 433.

In addition, the value of second result 120 accurately indicates the two sets of mismatched bits between primary data 1309 and redundant data 132. As described above, the non-zero value of second result 120 may be used to initiate a repair operation to identify failed bit cells and correct or replace the identified bit cells.

It is noted that the error detection circuits shown in FIGS. 3 and 4 are examples for demonstrating the disclosed concepts. Eight-bit data values are used in these examples, although, any suitable size of data value may be utilized. A number of logic gates used in the error detection circuit can scale to accommodate different sized data values.

The examples of FIGS. 3 and 4 illustrate how an error detection circuit may be adapted for use with non-volatile storage circuits that have different predominant failure modes. The error detection circuits and non-volatile storage circuits disclosed in FIGS. 1-4 may be used in a variety of computer systems. Two examples of such computer systems are illustrated in FIG. 5.

Figure 5:
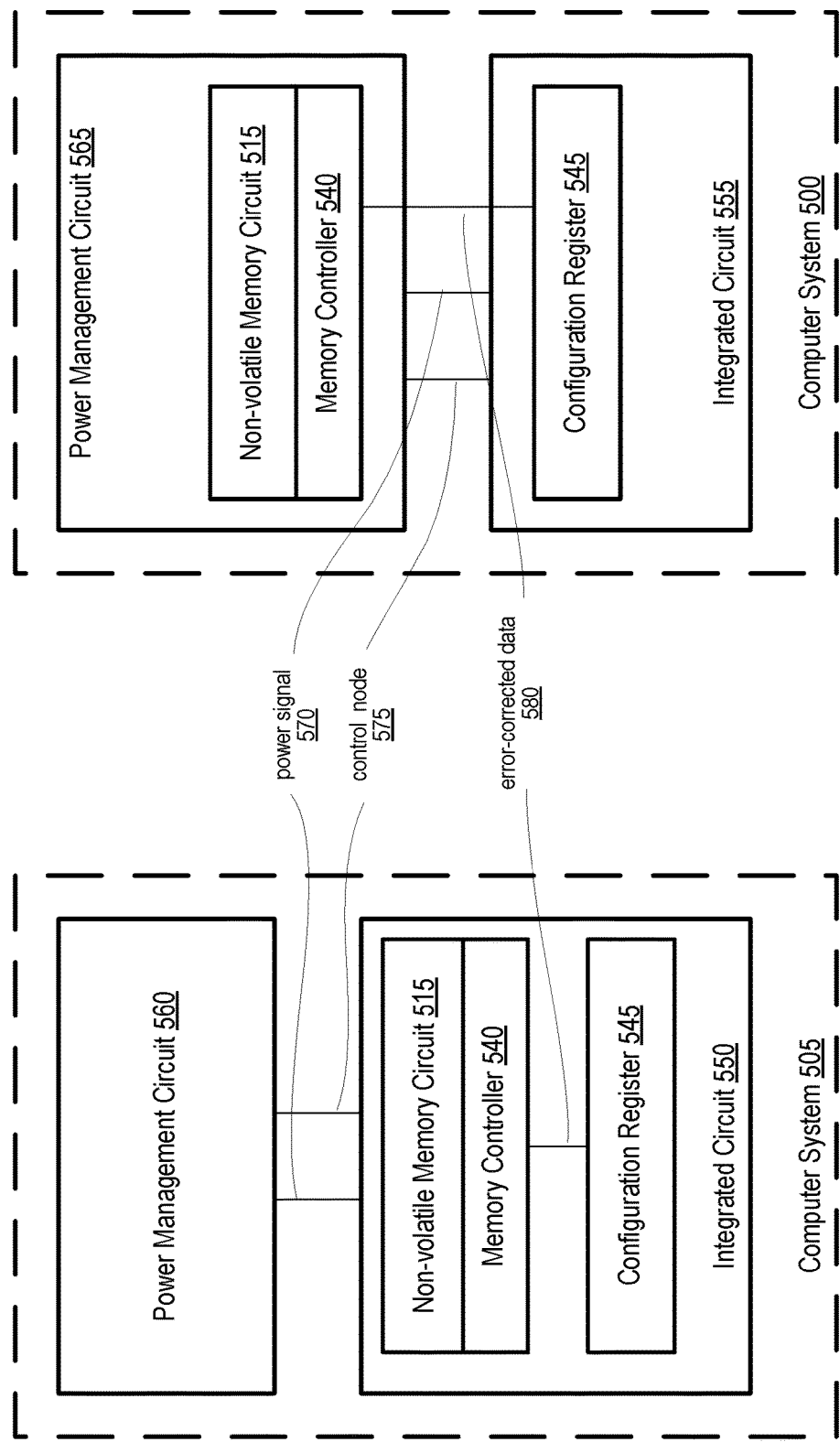
FIG. 5 includes block diagrams for two embodiments of computer systems that utilize a non-volatile memory circuit.

Moving now to FIG. 5, two embodiments of a computer system are depicted that each include a power management circuit and a processor circuit. The two computer systems illustrate two, non-limiting, examples of how a non-volatile memory circuit may be implemented in a computer system to provide initialization data to a configuration register. Such initialization data may include one or more settings for operating parameters of the computer system. In various embodiments, computer systems 500 and 505 may correspond to any suitable type of computer system such as a desktop computer, a server computer, a laptop computer, a smartphone, a tablet device, a wearable device, a smart-home appliance, and the like. In some embodiments, computer systems 500 and 505 may each correspond to multiple ICs included on one or more circuit boards, or may be integrated into single respective IC chips.

As illustrated, computer system 500 includes integrated circuit 555 and power management circuit 565. In various embodiments, power management circuit 565 may be a power management integrated circuit (PMIC) and/or may include a power management unit (PMU) for controlling one or more power signals used by integrated circuit 555. Integrated circuit 555 includes configuration register 545, while power management circuit 565 includes non-volatile memory circuit 515 and memory controller 540. Primary and redundant copies of a data value used to generate an initialization value for configuration register 545 are stored, using memory controller 540, in non-volatile memory circuit 515. In response to an indication to enable power signal 570 to power-on integrated circuit 555, power management circuit 565 is configured to retrieve the primary and redundant copies of the data value from non-volatile memory circuit 515. In accordance with techniques described above, power management circuit 565 generates (e.g., using memory controller 540) error-corrected data 580 to use as the initialization value. Power management circuit 565 further generates an error signal that may provide an indication of a mismatch between the primary and redundant copies of the data value. If a mismatch is indicated, then memory controller 540 may initiate a repair procedure to identify and repair or replace one or more failing bit cells.

Prior to storing error-corrected data 580 in configuration register 545, power management circuit 565 is further configured to assert control node 575 of integrated circuit 555 to prevent integrated circuit 555 from operating. Control node 575, as illustrated, may correspond to a reset or halt input node that, when asserted, causes integrated circuit 555 to halt or pause operation until control node 575 is de-asserted. In response to the assertion, power management circuit 565 is configured to enable power signal 570. After power has been enabled, power management circuit 565 may send error-corrected data 580 to integrated circuit 555 to be stored in configuration register 545. In some embodiments, the assertion of control node 575 may allow power management circuit 565 to access configuration register 545 directly. In other embodiments, integrated circuit 555 may be operable, with control node 575 asserted, to receive and store error-corrected data 580 into configuration register 545. Subsequent to storing error-corrected data 580 in the configuration register, power management circuit 565 is further configured to de-assert control node 575 of integrated circuit 555. With configuration register 545 initialized and the de-assertion of control node 575, integrated circuit 555 may proceed with normal operations.

Computer system 505 illustrates another example of how a non-volatile memory circuit may be implemented into a computer system. In computer system 500, non-volatile memory circuit 515 is located in power management circuit 565. In computer system 505, non-volatile memory circuit 515 is located within integrated circuit 550.

Computer system 505, as shown, includes power management circuit 560 and integrated circuit 550. Like power management circuit 565, power management circuit 560 may be a PMIC and/or may include a PMU for controlling one or more power signals used by integrated circuit 550. Integrated circuit 550, as stated, includes non-volatile memory circuit 515, memory controller 540 and configuration register 545. In a similar manner as in computer system 500, non-volatile memory circuit 515 is used to store an initialization value for configuration register 545. Primary and redundant copies of the initialization value are stored (e.g., using memory controller 540) in non-volatile memory circuit 515. While integrated circuit 550 is powered down, non-volatile memory circuit 515 retains the primary and redundant copies of the initialization value.

In response to an indication to enable power to integrated circuit 550, power management circuit 560 asserts control node 575 and increases a voltage level of power signal 570. As illustrated, the assertion of control node 575 causes integrated circuit 550 to retrieve the primary and redundant copies of the initialization value from non-volatile memory circuit 515. Using techniques described above, memory controller 540 generates error-corrected data 580 to use as the initialization value for configuration register 545. Memory controller 540 further generates an error signal that may provide an indication of a mismatch between the primary and redundant copies of the data value. Error-corrected data 580 is copied into configuration register 545. If the error signal indicates a mismatch, then integrated circuit 550 may initiate a repair process, as described above. After error-corrected data is stored to configuration register 545, integrated circuit 550 may be ready to perform normal operating tasks. In some embodiments, integrated circuit 550 may assert an indication to power management circuit 560 to indicate that configuration register has been initialized and that control node 575 may be de-asserted. In other embodiments, power management circuit 560 may de-assert control node 575 after a default period of time from the assertion.

It is noted that FIG. 5 is merely an example. The block diagrams of computer systems 500 and 505 have been simplified for clarity. In other embodiments, additional circuit blocks may be included, such as other memory circuits, clock generation circuits, communication circuits, and the like.

The circuits described above in FIGS. 1-5 may perform error detection and correction operations on data read from a non-volatile memory using a variety of methods. Two such methods for error detection and correction operations on a non-volatile memory circuit are described in FIGS. 6 and 7.

Figure 6:
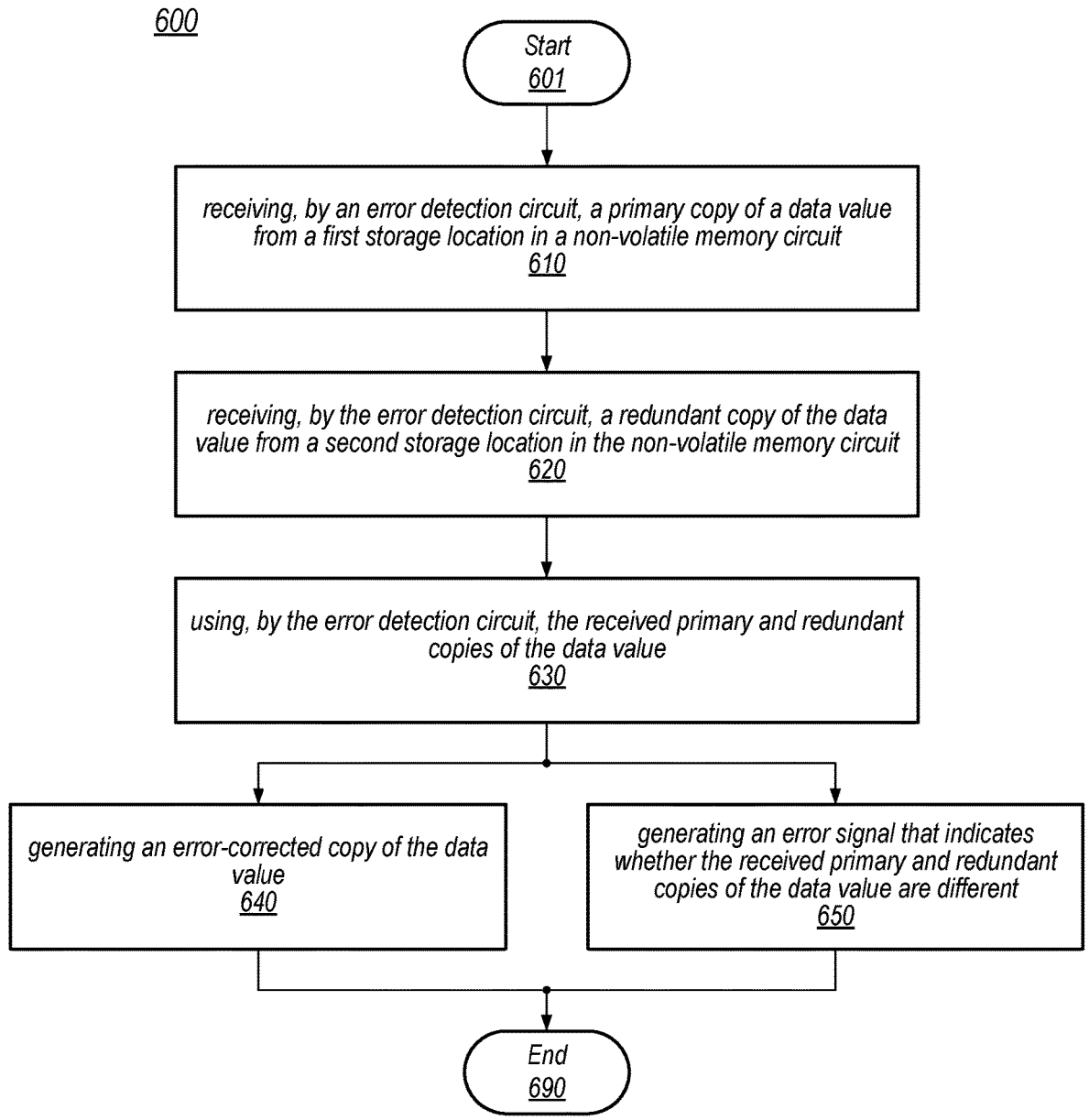
FIG. 6 shows a flow diagram of an embodiment of a method for detecting and correcting errors in a non-volatile memory circuit.

Turning now to FIG. 6, a flow diagram for an embodiment of a method for detecting and correcting errors in data retrieved from a non-volatile memory circuit is shown. Method 600 may be performed by a non-volatile memory circuit, for example, non-volatile memory circuit 100 in FIG. 1. Referring collectively to FIGS. 1 and 6, method 600 begins in block 601.

Method 600 includes, at block 610, receiving, by an error detection circuit, a primary copy of a data value from a first storage location in a non-volatile memory circuit. As shown, primary data 130 is received by error detection circuit 105 from non-volatile storage circuit 103. In some embodiments, primary data 130 is received in response to a request for configuration data for initializing an IC, such as integrated circuits 550 and 555 in FIG. 5. Configuration data may be requested in response to a variety of events, such as a power-on of the IC, a reset of the IC, or other type of re-initialization of the IC.

At block 620, the method includes receiving, by the error detection circuit, a redundant copy of the data value from a second storage location in the non-volatile memory circuit. Redundant data 132, as illustrated, is also received by error detection circuit 105 from non-volatile storage circuit 103. Both primary data 130 and redundant data 132 are programmed into non-volatile storage circuit 103 with a same data value. This programming step may be performed by a manufacturer of an IC that includes non-volatile memory circuit 100, or during manufacturing of a product that includes such an IC.

Method 600 further includes, at block 630, using, by the error detection circuit, the received primary and redundant copies of the data value. Over a period of time, a given memory bit cell of non-volatile storage circuit 103 may degrade and an attempt to read a data value from the given memory bit cell may result in a value other than the programmed value being interpreted by reading circuits. For example, the given bit cell may store a logic low value in an unprogrammed state and store a logic high value in a programmed state. Over time, a programmed bit cell may degrade such that the reading circuits mistakenly interpret that the programmed bit cell is unprogrammed, and generate an erroneous logic low value rather than the intended logic high value. Use of both primary data 130 and redundant data 132 may help to mitigate generation of an incorrect data value due to one or more degraded bit cells.

At block 640, to use the received primary and redundant copies of the data value, method 600 includes generating an error-corrected copy of the data value. As illustrated, error detection circuit 105 includes first comparison circuit 114 to generate the error-corrected copy of the data value stored in non-volatile storage circuit 103. First comparison circuit 114 may generate the error-corrected copy using a characteristic of the bit cells used in non-volatile storage circuit 103. For example, these bit cells may have a predominant failure mode in which a logic high value is more likely to be misread as a logic low value, or vice versa. Using the predominant failure mode, a bitwise comparison between primary data 130 and redundant data 132 may allow first comparison circuit 114 to generate a corrected copy of the stored data value.

The using of the received primary and redundant copies of the data value further includes, at block 650 in method 600, generating an error signal that indicates whether the received primary and redundant copies of the data value are different. Error detection circuit 105 also includes second comparison circuit 116. To detect if a given bit cell has been misread, second comparison circuit 116, similar to first comparison circuit 114, performs a bit-wise comparison between primary data 130 and redundant data 132. Second comparison circuit 116 indicates instances in which a value of a particular bit of primary data 130 does not match a value of a corresponding bit of redundant data 132. In various embodiments, second comparison circuit 116 generates a single error signal 136 that indicates one or more instances of failed bit cells, or generates a respective error signal 136 for each pair of primary and redundant bits. Method 600 ends in block 690.

It is noted that the operations in blocks 640 and 650 may be performed in parallel. As noted above, the term parallel is not intended to imply that the two operations begin and/or end at precisely the same time. Instead, operations 640 and 650 may overlap with different starting and stopping points. Performing operations 640 and 650 in parallel does not include, e.g., completing operation 640 and then starting operation 650. This parallel method of generating both an error-corrected copy of the data value and an error signal may allow the stored data value to be used in a shorter period of time as compared to a method in which errors are detected first, and then corrected after being detected. While the error-corrected value is being used, the non-volatile memory circuit may initiate a repair procedure to avoid a failed bit cell from being misread in a subsequent access.

Method 600 illustrates a technique for identifying and correcting bit errors in data read from a non-volatile storage circuit. As disclosed, a repair procedure may be implemented in some embodiments to correct a failing bit cell. Such a method is illustrated in FIG. 7.

Figure 7:
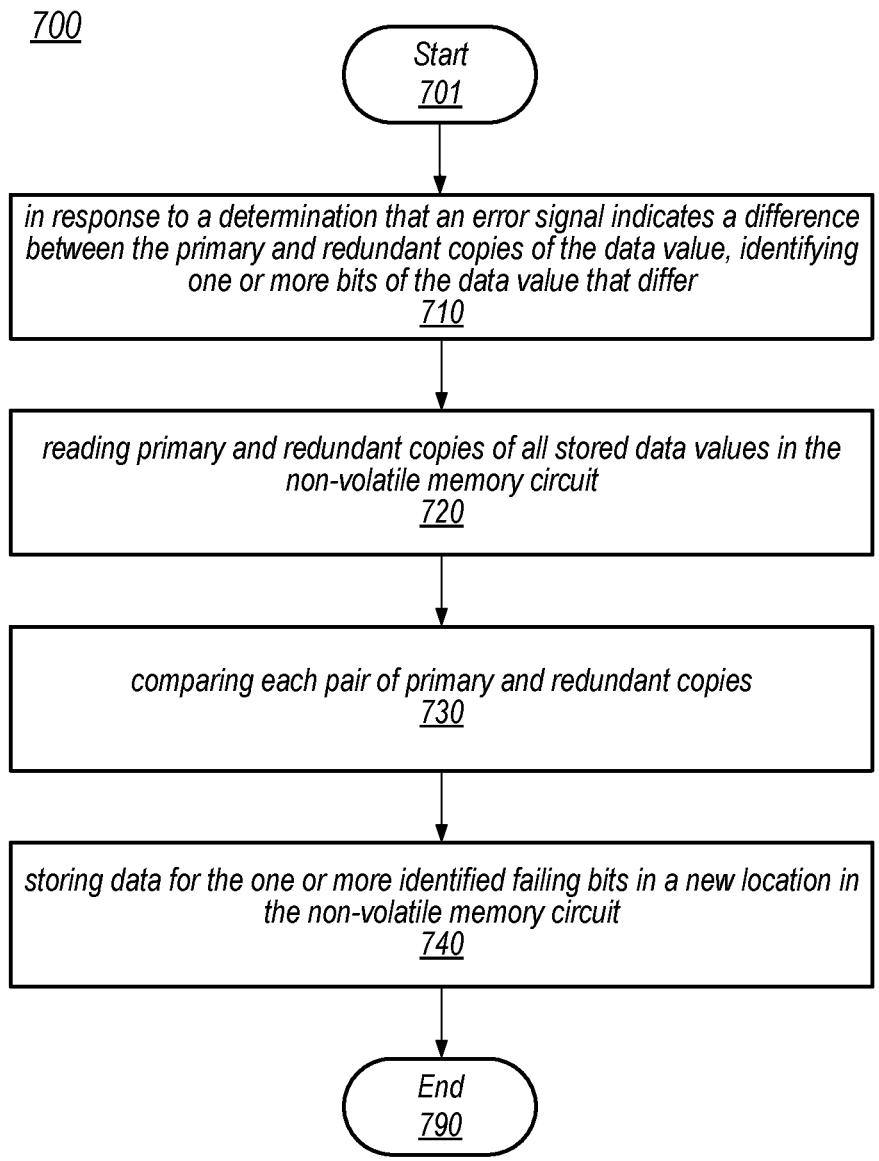
FIG. 7 illustrates a flow diagram of an embodiment of a method for repairing identified bit cells in a non-volatile memory circuit.

Proceeding now to FIG. 7, a flow diagram of a method for repairing a failed bit cell in a non-volatile storage circuit is illustrated. Method 700 may be performed by a non-volatile memory circuit such as non-volatile memory circuit 100 in FIG. 1. In some embodiments, method 700 may be performed in combination with method 600 in FIG. 6. For example, method 700 may be performed in whole, or in part, in response to an indication of a failed bit cell from operation 650 of method 600. Referring collectively to FIGS. 1 and 7, method 700 begins in block 701 with block 650 of method 600 having generated an error signal.

At block 710, method 700 includes, in response to a determination that the error signal indicates a difference between the primary and redundant copies of the data value, identifying one or more bits of the data value that differ. In response to error signals 136 indicating that at least one pair of bits between primary data 130 and redundant data 132 have mismatched values, non-volatile memory circuit 100 identifies differing bit values. As illustrated, non-volatile memory circuit 100 identifies failed bit cells throughout non-volatile storage circuit 103. In other embodiments, non-volatile memory circuit 100 may limit a search for failed bit cells to a portion of non-volatile storage circuit 103, such as failed bit cells in primary data 130 and redundant data 132.

Method 700 further includes, at block 720, reading primary and redundant copies of all stored data values in the non-volatile memory circuit. As shown, non-volatile memory circuit 100 reads each primary data value and its corresponding redundant data. In some embodiments, primary data 130 and redundant data 132 may correspond to one of multiple data values stored in non-volatile storage circuit 103. If error signals 136 indicate a failure of at least one bit cell associated with primary data 130 and redundant data 132, then failures of bit cells associated with one or more of the other data values is also possible. Non-volatile memory circuit 100, therefore, reads all pairs of primary and redundant copies of data values to identify all failed bit cells.

At block 730 method 700 further includes comparing each pair of primary and redundant copies. For each data value stored in non-volatile storage circuit 103, error detection circuit 105, for example, using second comparison circuit 116, compares the primary copy of the data value to the corresponding redundant copy. Specific failing bit cells are identified based on which data bit pairs produce a mismatch indicator. For example, the specific mismatched data bits may be identified using XOR gates 252 in FIG. 2, with a logic high output of a given XOR gate indicating a mismatch of the corresponding bit pair input to the given XOR gate. In some embodiments, a list of failing data bits in generated, while, in other embodiments, each identified failing bit may be processed as it is identified.

Method 700 also includes, at block 740 storing data for the one or more identified failing bits in a new location in the non-volatile memory circuit. If a memory technology used for non-volatile storage circuit 103 supports erasing and reprogramming (e.g., flash and EEPROM), then data locations that include the identified failing bit cells may reprogrammed. In other embodiments that utilize a one-time programmable (OTP) memory (e.g., fuses and encapsulated EPROM), a replacement bit cell may be identified and programmed with the correct value. For example, a memory array such as memory array 240 or 242, may include one or more spare rows and/or spare columns of bit cells. Programming circuits in non-volatile memory circuit 100 may remap a failing bit cell to one of the spare cells. In some embodiments, an entire row or column that includes the failing bit cell may be remapped, with the spare row/column being programmed with the corresponding data from the failing row/column. The method ends in block 790.

It is noted that methods 600 and 700 of FIGS. 6 and 7 are merely examples. Variations of the disclosed methods are contemplated. For example, operations 610 and 620 of method 600 are illustrated as occurring serially. In other embodiments, operations 610 and 620 may be performed in the opposite order or in parallel.

Figure 8:
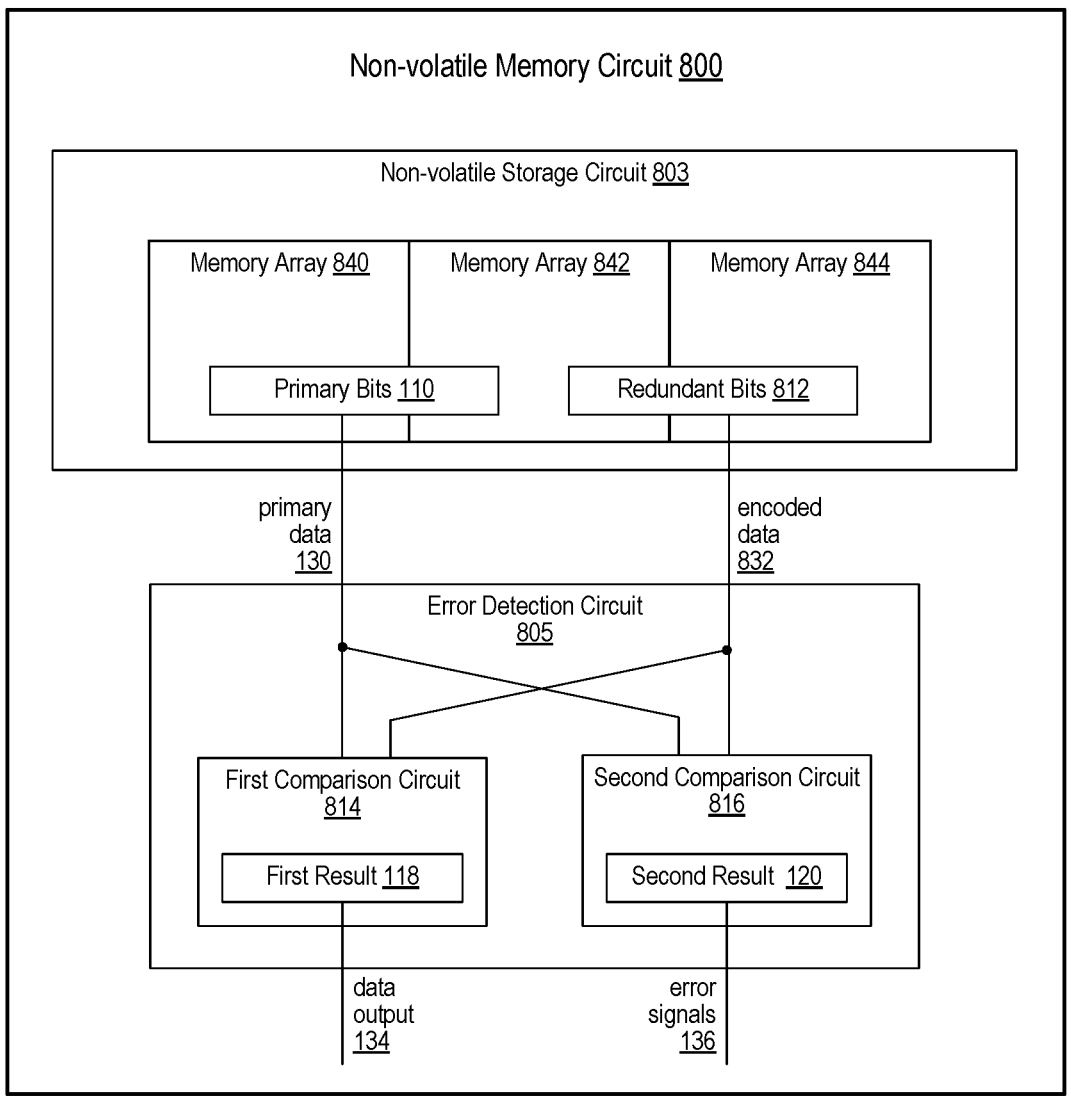
FIG. 8 depicts a block diagram of another embodiment of a non-volatile memory circuit.
Figure 9:
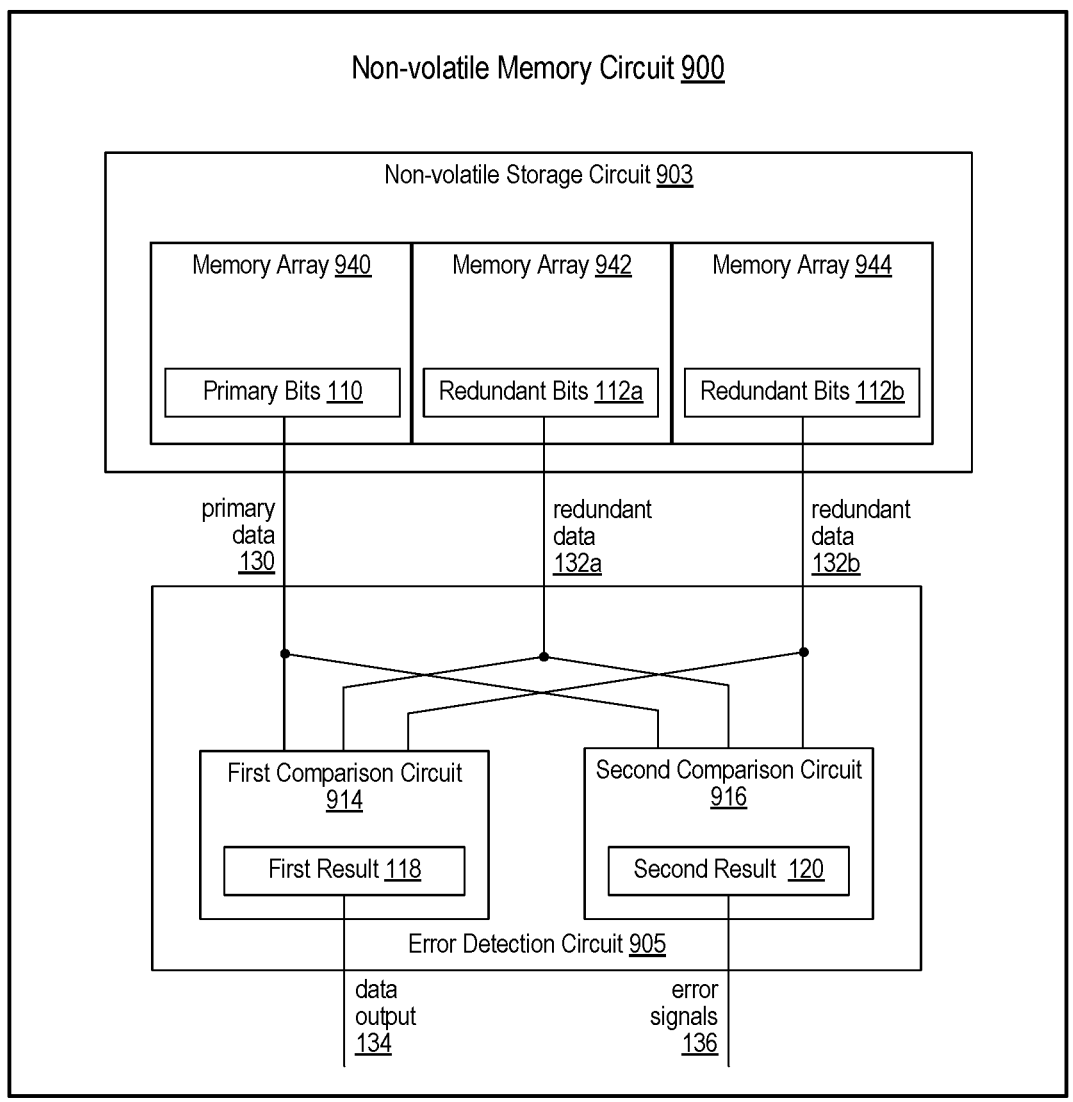
FIG. 9 shows a block diagram of a different embodiment of a non-volatile memory circuit.

Additional examples of non-volatile memory circuits that include error detection and correction circuits are illustrated in FIGS. 8 and 9. The embodiments of FIGS. 8 and 9 show further techniques that may be utilized for storing and using redundant data in error correction and detection operations.

Turning to FIG. 8, another embodiment of a non-volatile memory circuit is shown. Non-volatile memory circuit 800 is similar to non-volatile memory circuit 100 in FIG. 1. In a similar manner as described for non-volatile memory circuit 100, non-volatile memory circuit 800 may retrieve primary and redundant data from a memory storage circuit and perform error correction and detection operations in parallel to generate a data output and error signals in as little as one system clock cycle. As illustrated, operation of non-volatile memory circuit 800, and its similarly named and numbered elements, is as described for non-volatile memory circuit 100, except as disclosed below.

As shown, non-volatile storage circuit 803 includes three memory arrays, 840, 842, and 844, although any suitable number of memory arrays may be included in other embodiments. Primary bits 110 include a combination of memory bit cells from memory array 840 and 842. In a similar manner, redundant bits 812 include a combination of memory bit cells in memory array 842 and 844. In other embodiments, primary bits 110 and redundant bits 812 may include various combinations of bit cells from any memory arrays included in non-volatile storage circuit 803.

In the embodiment of non-volatile memory circuit 100, redundant bits 112 are described as being used to store a redundant copy of a data value in which the primary and redundant copies are identical values. In non-volatile memory circuit 800, primary bits 110 are used to store primary data 130 while redundant bits 812 are used to store encoded data 832. As used herein, an "encoded value" refers to a value that represents an initial data value but may be altered using a particular function such that the encoded value may differ from the initial data value. The particular function may be, e.g., a complement, a two's complement, an encryption, a compression, or any other suitable function that transforms the initial data value.

For example, in one embodiment, encoded data 832 is a bitwise encoding of primary data 130 in which bit 0 of encoded data 832 (abbreviated as "E0") is the same as bit 0 of primary data 130 (abbreviated as "P0"). A subsequent bit x of encoded data 832 (Ex) is generated by performing a bitwise XOR between P0 and Px. Such an encoding technique results in encoded data 832 being identical to primary data 130 when P0 is zero and all bits of encoded data 832, except E0, being complemented when P0 is one.

In a similar manner as described in regards to FIG. 1, error detection circuit 805 is configured to retrieve contents of primary bits 110 and redundant bits 812 in response to a request for a data value. The received primary data 130 and encoded data 832 are each sent to both first comparison circuit 814 and second comparison circuit 816. First comparison circuit 814 includes logic circuits capable of comparing the values of primary data 130 and encoded data 832 to produce the requested data value as first result 118. Second comparison circuit 816, similarly, is configured to compare the values of primary data 130 and encoded data 832 to produce second result 120, which is an indication of bit errors in either primary bits 110 or redundant bits 812.

Another variation of a non-volatile memory circuit that utilizes the disclosed concepts, is illustrated in FIG. 9. Non-volatile memory circuit 900 is also similar to non-volatile memory circuit 100 in FIG. 1. Non-volatile memory circuit 900 may also retrieve primary and redundant data from a memory storage circuit and perform error correction and detection operations in parallel to generate a data output and error signals in as little as one system clock cycle, similar to non-volatile memory circuits 100 and 800. As shown, operation of non-volatile memory circuit 900, and its similarly named and numbered elements, is as described above for non-volatile memory circuit 100, with exceptions noted below.

In a similar manner as non-volatile storage circuit 803, non-volatile storage circuit 903 also includes three memory arrays, 940, 942, and 944, although any suitable number of memory arrays may be included in other embodiments. As shown, primary bits 110 are included in memory array 940, redundant bits 112a are included in memory array 942, and redundant bits 112b are included in memory array 944. In other embodiments, primary bits 110 and redundant bits 112a and 112b may include various combinations of bit cells from any memory arrays included in non-volatile storage circuit 903.

As illustrated, non-volatile memory circuit 900 is configured to store primary data 130 in primary bits 110 and to store redundant data 132a and 132b in redundant bits 112a and 112b. In this embodiment, the number of bit cells used to store the redundant data is greater than the number of bit cells used to store the primary data. In some embodiments, redundant data 132a and 132b may each include a same number of bits as primary data 130, thereby doubling an amount of redundancy for primary data 130. In such embodiments, redundant data 132a and/or redundant data 132b may be a redundant copy of primary data 130 with an identical value, or may be an encoded value as described above. In other embodiments, the number of bits in redundant data 132a and/or redundant data 132b may be different than the number of bits in primary data 130. For example, redundant data 132a may be an identical copy of primary data 130, while redundant data 132b includes other types of redundancy information such as a checksum and/or parity bit.

Error detection circuit 905 is configured to retrieve contents of primary bits 110 and redundant bits 112a and 112b in response to a request for a data value. The received primary data 130 and redundant data 132a and 132b are each sent to both first comparison circuit 914 and second comparison circuit 916. First comparison circuit 914 includes logic circuits capable of comparing the three values of primary data 130, redundant data 132a and redundant data 132b. The requested data value is generated and latched as first result 118 and sent to other circuits as data output 134. For example, if redundant data 132a and 132b are both stored as identical copies of primary data 130, then first comparison circuit 914 may include a respective three-input OR gate to generate each bit of first result 118, such that if any one of the three input bits (one bit apiece from primary data 130 and redundant data 132a and 132b) is a logic one, then the corresponding bit of first result 118 is also a logic one.

Second comparison circuit 916, similarly, is configured to compare the three values of primary data 130, redundant data 132a and redundant data 132b. Error signals are generated and latched as second result 120 and sent to other circuits as error signals 136. If, e.g., redundant data 132a and 132b are both stored as identical copies of primary data 130, then second comparison circuit 916 may include a respective three-input XOR gate to generate each bit of second result 120, such that if any one of the three input bits has a different logic state than the other two input bits, then the corresponding bit of second result 120 is a logic one to indicate an error in non-volatile storage circuit 903. If all three input bits match, then the corresponding bit of second result 120 is a logic zero.

It is noted that the embodiments of FIGS. 8 and 9 are merely examples to illustrate various ways that the disclosed concepts may be implemented. Use of encoded, particularly encrypted, data for redundancy data in non-volatile memory circuit 800 may provide increased security against a hacker attempting to assert control over a computer system that utilizes the stored data value to configure and/or secure the computer system. Use of an increased number of redundancy bits, as illustrated by non-volatile memory circuit 900 may provide an increased amount of protection against one or more bit failures in the memory arrays. As stated above, the various concepts disclosed in FIGS. 8 and 9 may be combined into a single embodiment.

Figure 10:
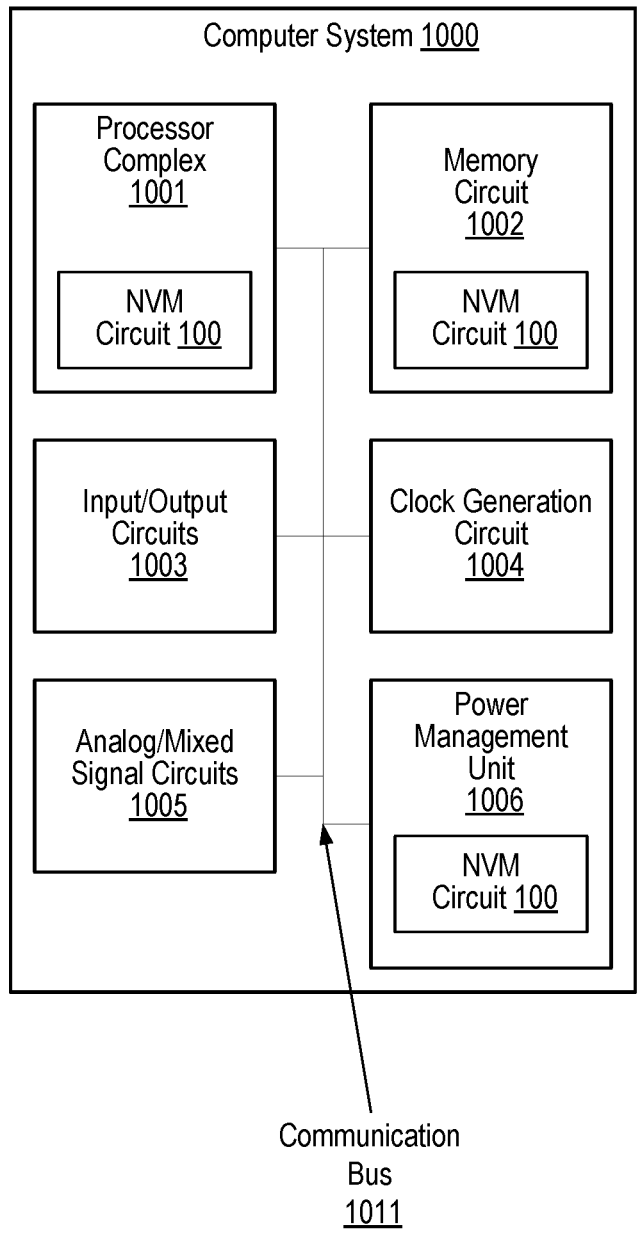
FIG. 10 depicts a block diagram of an embodiment of a computer system, according to some embodiments.

FIGS. 1-9 illustrate apparatus and methods for performing error detection and error correction on data retrieved from a non-volatile memory circuit. Non-volatile memory circuits, including error detection circuits, such as those described above, may be used in a variety of computer systems, such as a desktop computer, laptop computer, smartphone, tablet, wearable device, and the like. Other types of computer systems may include smart-home appliances such as virtual assistant devices, smart televisions, smart thermostats, and other devices supporting the Internet of Things (IoT) connectivity. In some embodiments, the circuits described above may be implemented on a system-on-chip (SoC) or other type of integrated circuit. A block diagram illustrating an embodiment of computer system 1000 that includes the disclosed circuits is illustrated in FIG. 10. Computer system 1000 may, in some embodiments, correspond to computer system 500 and/or computer system 505 in FIG. 5. As shown, computer system 1000 includes processor complex 1001, memory circuit 1002, input/output circuits 1003, clock generation circuit 1004, analog/mixed-signal circuits 1005, and power management unit 1006. These functional circuits are coupled to each other by communication bus 1011. As shown, processor complex 1001 and/or power management unit 1006 may include respective embodiments of non-volatile memory circuit 100.

Processor complex 1001, in various embodiments, may be representative of a general-purpose processor that performs computational operations. For example, processor complex 1001 may be a central processing unit (CPU) such as a microprocessor, a microcontroller, an application-specific integrated circuit (ASIC), or a field-programmable gate array (FPGA). In some embodiments, processor complex 1001 may correspond to a special purpose processing core, such as a graphics processor, audio processor, or neural processor, while in other embodiments, processor complex 1001 may correspond to a general-purpose processor configured and/or programmed to perform one such function. Processor complex 1001, in some embodiments, may include a plurality of general and/or special purpose processor cores as well as supporting circuits for managing, e.g., power signals, clock signals, and memory requests. In addition, processor complex 1001 may include one or more levels of cache memory to fulfill memory requests issued by included processor cores. Processor complex 1001 may, in some embodiments, include an embodiment of non-volatile memory circuit 100 to store one or more data values, such as configuration and initialization values for processor complex 1001 and/or computer system 1000.

Memory circuit 1002, in the illustrated embodiment, includes one or more memory circuits for storing instructions and data to be utilized within computer system 1000 by processor complex 1001. In various embodiments, memory circuit 1002 may include any suitable type of memory such as a dynamic random-access memory (DRAM), a static random access memory (SRAM), a read-only memory (ROM), electrically erasable programmable read-only memory (EEPROM), or a non-volatile memory, for example. It is noted that in the embodiment of computer system 1000, a single memory circuit is depicted. In other embodiments, any suitable number of memory circuits may be employed. In some embodiments, memory circuit 1002 may include a memory controller circuit as well communication circuits for accessing memory circuits external to computer system 1000.

Input/output circuits 1003 may be configured to coordinate data transfer between computer system 1000 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 1003 may be configured to implement a version of Universal Serial Bus (USB) protocol or IEEE 1394 (Firewire®) protocol.

Input/output circuits 1003 may also be configured to coordinate data transfer between computer system 1000 and one or more devices (e.g., other computing systems or integrated circuits) coupled to computer system 1000 via a network. In one embodiment, input/output circuits 1003 may be configured to perform the data processing necessary to implement an Ethernet (IEEE 802.3) networking standard such as Gigabit Ethernet, for example, although it is contemplated that any suitable networking standard may be implemented.

Clock generation circuit 1004 may be configured to enable, configure and manage outputs of one or more clock sources. In various embodiments, the clock sources may be located in analog/mixed-signal circuits 1005, within clock generation circuit 1004, in other blocks with computer system 1000, or come from a source external to computer system 1000, coupled through one or more I/O pins. In some embodiments, clock generation circuit 1004 may be capable of enabling and disabling (e.g., gating) a selected clock source before it is distributed throughout computer system 1000. Clock generation circuit 1004 may include registers for selecting an output frequency of a phase-locked loop (PLL), delay-locked loop (DLL), frequency-locked loop (FLL), or other type of circuits capable of adjusting a frequency, duty cycle, or other properties of a clock or timing signal.

Analog/mixed-signal circuits 1005 may include a variety of circuits including, for example, a crystal oscillator, PLL or FLL, and a digital-to-analog converter (DAC) (all not shown) configured to generated signals used by computer system 1000. In some embodiments, analog/mixed-signal circuits 1005 may also include radio frequency (RF) circuits that may be configured for operation with cellular telephone networks. Analog/mixed-signal circuits 1005 may include one or more circuits capable of generating a reference voltage at a particular voltage level, such as a voltage regulator or band-gap voltage reference.

Power management unit 1006 may be configured to generate a regulated voltage level on a power supply signal for processor complex 1001, input/output circuits 1003, memory circuit 1002, and other circuits in computer system 1000. In various embodiments, power management unit 1006 may include one or more voltage regulator circuits, such as, e.g., a buck regulator circuit, configured to generate the regulated voltage level based on an external power supply (not shown). In some embodiments any suitable number of regulated voltage levels may be generated. Additionally, power management unit 1006 may include various circuits for managing distribution of one or more power signals to the various circuits in computer system 1000, including maintaining and adjusting voltage levels of these power signals. Power management unit 1006 may, in some embodiments, include an embodiment of non-volatile memory circuit 100 to store one or more initialization values. In various embodiments, this embodiment of non-volatile memory circuit 100 may be in addition to, or in place of an embodiment in processor complex 1001.

It is noted that the embodiment illustrated in FIG. 10 includes one example of a computer system. A limited number of circuit blocks are illustrated for simplicity. In other embodiments, any suitable number and combination of circuit blocks may be included. For example, in other embodiments, security and/or cryptographic circuit blocks may be included.

Figure 11:
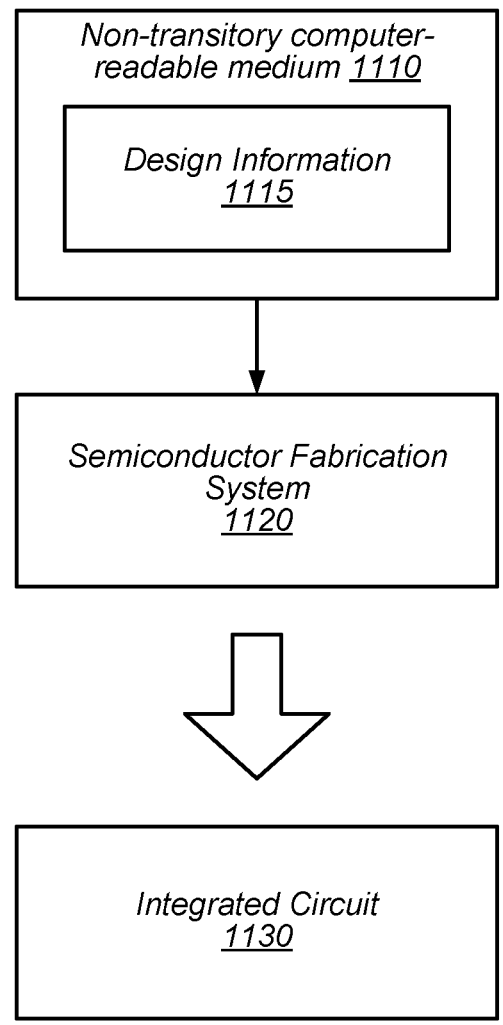
FIG. 11 illustrates a block diagram depicting an example computer-readable medium, according to some embodiments.

FIG. 11 is a block diagram illustrating an example of a non-transitory computer-readable storage medium that stores circuit design information, according to some embodiments. The embodiment of FIG. 11 may be utilized in a process, such as a very-large-scale integration (VLSI) process, to design and manufacture integrated circuits, such as, integrated circuits 550 and 555 in FIG. 5, or an IC that includes computer system 1000 of FIG. 10. In the illustrated embodiment, semiconductor fabrication system 1120 is configured to process the design information 1115 stored on non-transitory computer-readable storage medium 1110 and fabricate integrated circuit 1130 based on the design information 1115.

Non-transitory computer-readable storage medium 1110, may comprise any of various appropriate types of memory devices or storage devices. Non-transitory computer-readable storage medium 1110 may be an installation medium, e.g., a CD-ROM, floppy disks, or tape device; a computer system memory or random-access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Non-transitory computer-readable storage medium 1110 may include other types of non-transitory memory as well or combinations thereof. Non-transitory computer-readable storage medium 1110 may include two or more memory mediums which may reside in different locations, e.g., in different computer systems that are connected over a network.

Design information 1115 may be specified using any of various appropriate computer languages, including hardware description languages such as, without limitation: VHDL, Verilog, SystemC, SystemVerilog, RHDL, M, MyHDL, etc. Design information 1115 may be usable by semiconductor fabrication system 1120 to fabricate at least a portion of integrated circuit 1130. The format of design information 1115 may be recognized by at least one semiconductor fabrication system, such as semiconductor fabrication system 1120, for example. In some embodiments, design information 1115 may include a netlist that specifies elements of a cell library, as well as their connectivity. One or more cell libraries used during logic synthesis of circuits included in integrated circuit 1130 may also be included in design information 1115. Such cell libraries may include information indicative of device or transistor level netlists, mask design data, characterization data, and the like, of cells included in the cell library.

Integrated circuit 1130 may, in various embodiments, include one or more custom macrocells, such as memories, analog or mixed-signal circuits, and the like. In such cases, design information 1115 may include information related to included macrocells. Such information may include, without limitation, schematics capture database, mask design data, behavioral models, and device or transistor level netlists. As used herein, mask design data may be formatted according to graphic data system (gdsii), or any other suitable format.

Semiconductor fabrication system 1120 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 1120 may also be configured to perform various testing of fabricated circuits for correct operation.

In various embodiments, integrated circuit 1130 is configured to operate according to a circuit design specified by design information 1115, which may include performing any of the functionality described herein. For example, integrated circuit 1130 may include any of various elements shown or described herein. Further, integrated circuit 1130 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
    a non-volatile storage circuit that includes a primary copy of a data value in a first storage location and a redundant copy of the data value in a second, different storage location, wherein the data value is encoded using one or more bits; and
    an error detection circuit, including first and second comparison circuits, configured to:
        retrieve contents of the first and second storage locations in response to a request for the data value;
        wherein the first comparison circuit is configured to perform an error correction operation on the retrieved contents of the first and second storage locations to generate a data output responsive to the request, wherein the error correction operation is based on a predominant failure mode; and
        wherein the second comparison circuit is configured to perform an error detection operation to generate an error signal that indicates whether the retrieved contents of the first and second storage locations are different.

2. The apparatus of claim 1, wherein the error detection circuit is further configured to perform the error correction operation and the error detection operation in parallel.

3. The apparatus of claim 1, wherein the non-volatile storage circuit includes a plurality of fuse circuits.

4. The apparatus of claim 1, wherein the data value includes settings for initializing an integrated circuit, and wherein the request for the data value corresponds to an indication that the integrated circuit is beginning to power on.

5. The apparatus of claim 1, wherein the redundant copy of the data value is a transformed version of the primary copy of the data value.

6. The apparatus of claim 1, wherein the non-volatile storage circuit includes a plurality of rows of memory cells, and wherein memory cells for corresponding data bits in the first and second storage locations are located in different rows of memory cells.

7. The apparatus of claim 1, wherein to perform the error correction operation, the error detection circuit is configured to perform a bitwise logical-OR function between the retrieved contents of the first storage location and the second storage location; and
    wherein to perform the error detection operation, the error detection circuit is configured to perform a bitwise logical-XOR function between the retrieved contents of the first storage location and the second storage location.

8. A method comprising:
    receiving, by an error detection circuit, a primary copy of a data value from a first storage location in a non-volatile memory circuit;
    receiving, by the error detection circuit, a redundant copy of the data value from a second storage location in the non-volatile memory circuit;
    using, by the error detection circuit, the received primary and redundant copies of the data value:
        generating, using a first comparison circuit, an error-corrected copy of the data value, wherein error correction is based on a predominant failure mode; and
        generating, using a second comparison circuit, an error signal that indicates whether the received primary and redundant copies of the data value are different.

9. The method of claim 8, wherein the generating of the error-corrected copy of the data value overlaps with the generating of the error signal.

10. The method of claim 8, further comprising receiving the primary and redundant copies of the data value occur in response to a request for configuration data for initializing an integrated circuit.

11. The method of claim 8, wherein the generating of the error-corrected copy of the data value includes generating a correct value of the error-corrected copy when errors are present in the primary copy of the data value and no errors are present in the redundant copy of the data value.

12. The method of claim 8, wherein the generating of the error-corrected copy of the data value includes generating a correct value of the error-corrected copy when errors are present in the redundant copy of the data value and no errors are present in the primary copy of the data value.

13. The method of claim 8, wherein the non-volatile memory circuit includes a plurality of bit cells arranged in a plurality of rows and columns; and wherein the method further comprises:
    storing, by a memory controller circuit, individual bits of the primary copy of the data value in respective ones of a first set of bit cells, wherein at least one of the first set of bit cells is located in a different row and a different column from the remaining bit cells of the first set; and
    storing, by the memory controller circuit, individual bits of the redundant copy of the data value in respective ones of a second set of bit cells, wherein at least one of the second set of bit cells is located in a different row and a different column from the remaining bit cells of the second set.

14. The method of claim 8, wherein the generating of the error-corrected copy of the data value includes performing a bitwise logical-OR function using the primary copy and the redundant copy, and wherein the generating of the error signal includes performing a bitwise logical-XOR function using the primary copy and the redundant copy.

15. A system comprising:
An integrated circuit including a configuration register; and
a power management circuit configured to:
  store a primary copy of a data value in a first storage location in a non-volatile memory circuit, and store a redundant copy of the data value in a second, different storage location in the non-volatile memory circuit;
  retrieve the primary and redundant copies of the data value from the non-volatile memory circuit;
  generate, using a first comparison circuit, an error-corrected copy of the data value using the retrieved primary and redundant copies of the data value, wherein error correction is based on a predominant failure mode;
  generating, using a second comparison circuit, an error signal that indicates whether the retrieved primary and redundant copies of the data value are different; and
  storing the error-corrected copy of the data value in the configuration register.

16. The system of claim 15, wherein the power management circuit is further configured to:
  in response to a determination that the error signal indicates a difference between the primary and redundant copies of the data value, identify one or more bits of the data value that differ; and
  store data for the one or more identified failing bits in a new location in the non-volatile memory circuit.

17. The system of claim 16, wherein to identify the one or more bits of the data value that differ, the power management circuit is further configured to:
  read primary and redundant copies of stored data values in the non-volatile memory circuit; and
  compare values of corresponding primary and redundant copies.

18. The system of claim 15, wherein the power management circuit is further configured to retrieve the primary and redundant copies of the data value from the non-volatile memory circuit in response to receiving an indication to enable a power signal to power-on the integrated circuit.

19. The system of claim 18, wherein the power management circuit is further configured to, prior to storing the error-corrected copy of the data value in the configuration register:
  assert a control node of the integrated circuit to prevent the integrated circuit from operating; and
  in response to the assertion, enable the power signal.

20. The system of claim 19, wherein the power management circuit is further configured to, subsequent to storing the error-corrected copy of the data value in the configuration register, de-assert the control node of the integrated circuit.

* * * * *